United States Patent [19]

Tatsanakit et al.

[11] Patent Number: 5,059,558
[45] Date of Patent: Oct. 22, 1991

[54] USE OF VENTING SLOTS TO IMPROVE HERMETIC SEAL FOR SEMICONDUCTOR DICE HOUSED IN CERAMIC PACKAGES

[75] Inventors: Thawatchai Tatsanakit, Bangkok; Thana Amnatsing, Nonthaburi, both of Thailand

[73] Assignee: North American Philips Corp., Signetics Division, Sunnyvale, Calif.

[21] Appl. No.: 547,412

[22] Filed: Jul. 2, 1990

Related U.S. Application Data

[63] Continuation of Ser. No. 210,051, Jun. 22, 1988, abandoned.

[51] Int. Cl.$^5$ .............................................. H01L 23/02
[52] U.S. Cl. .................................. 437/216; 437/218; 264/272.17
[58] Field of Search ............... 437/209, 214, 215, 216, 437/218, 219; 264/272.17

[56] References Cited

U.S. PATENT DOCUMENTS

| 4,139,726 | 2/1979 | Penrod et al. | 437/218 |
| 4,761,518 | 8/1988 | Butt et al. | 437/217 |

FOREIGN PATENT DOCUMENTS

| 53-39859 | 4/1978 | Japan . |
| 56-61148 | 5/1981 | Japan . |
| 57-88738 | 6/1982 | Japan . |
| 59-121146 | 12/1982 | Japan . |
| 59-32156 | 2/1984 | Japan . |
| 59-127853 | 7/1984 | Japan . |
| 60-117644 | 6/1985 | Japan . |
| 62-76742 | 4/1987 | Japan . |
| 62-171131 | 9/1987 | Japan . |
| 63-95651 | 4/1988 | Japan . |

Primary Examiner—Olik Chaudhuri
Assistant Examiner—Andrew Griffis
Attorney, Agent, or Firm—A. Tamoshunas; J. Haken; R. Meetin

[57] ABSTRACT

In hermetically sealing a base structure (10) of a ceramic package for a semiconductor device to a cap structure (12) of the device, one or more venting slots (36) are initially provided in the base sealing layer (16) or in the cap sealing layer (26). The base and cap structures are then fused together along the two sealing layers and electrical leads (20) by bringing the structures into contact and heating them to a temperature high enough to cause the sealing material to flow readily. The venting slots allow air to escape during the fusing step. This inhibits the formation of air bubbles along the sealing interface and thereby improves the hermeticity of the seal. The structures are subsequently cooled to harden the sealing layers into a unitary layer (28).

11 Claims, 3 Drawing Sheets

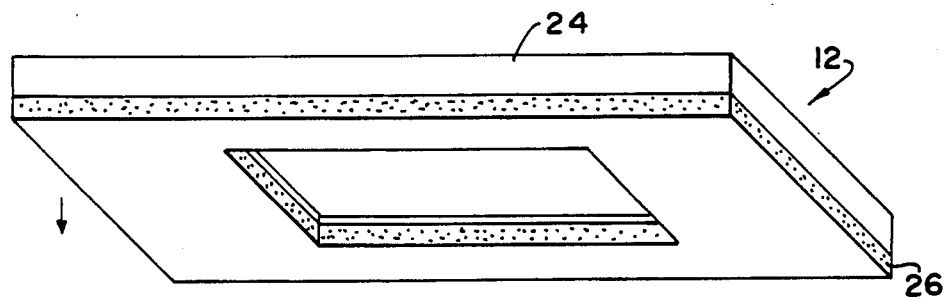
Fig. 1a
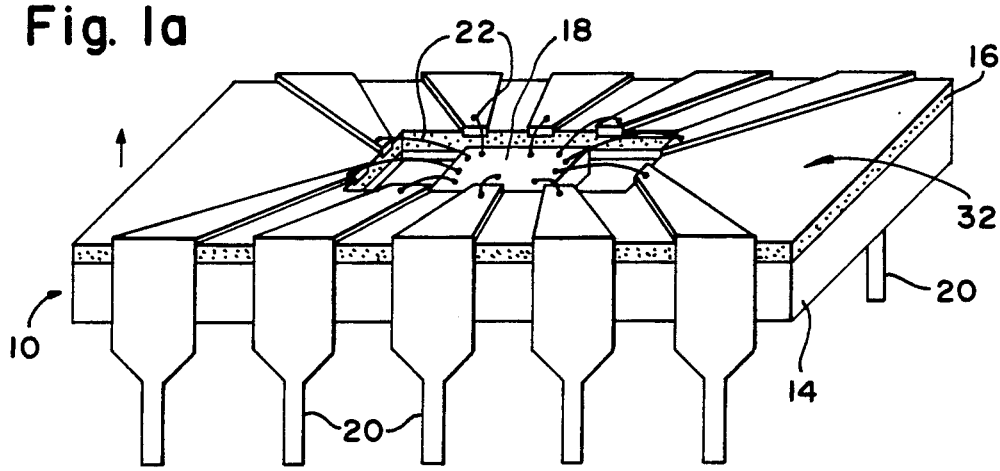
PRIOR ART
Fig. 1b
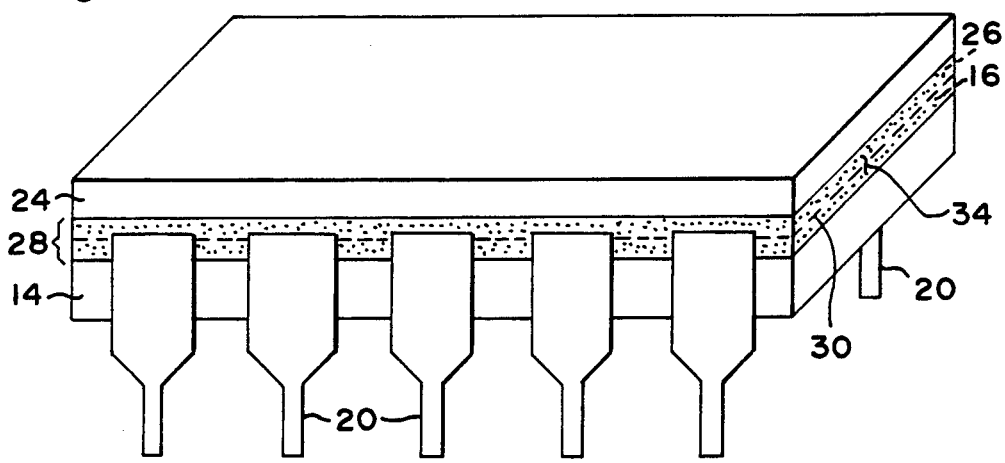

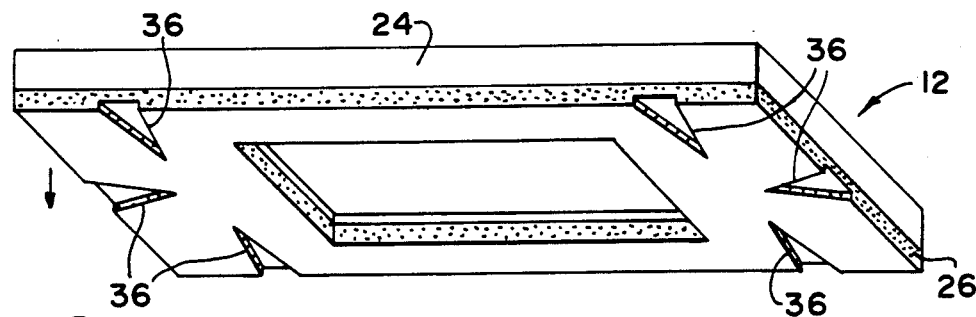
Fig. 2a
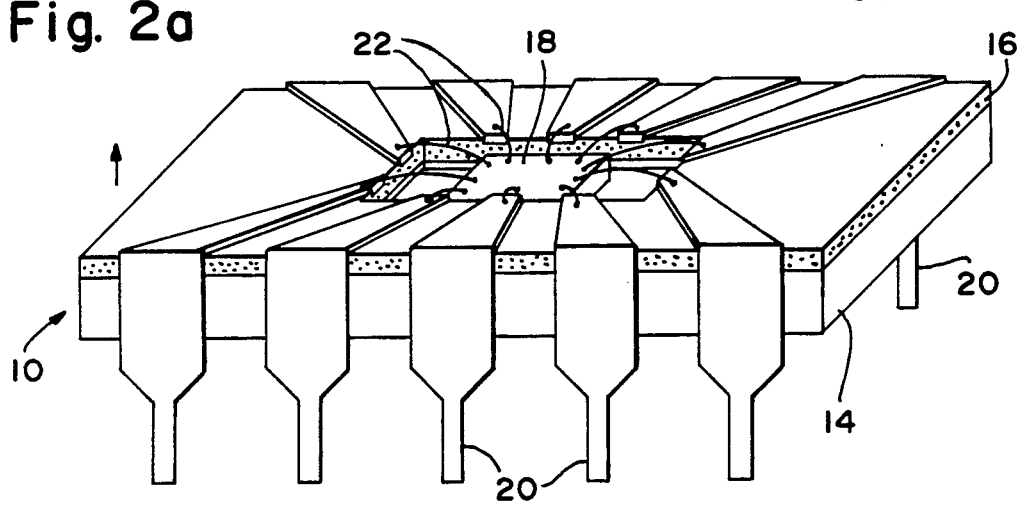
Fig. 2b
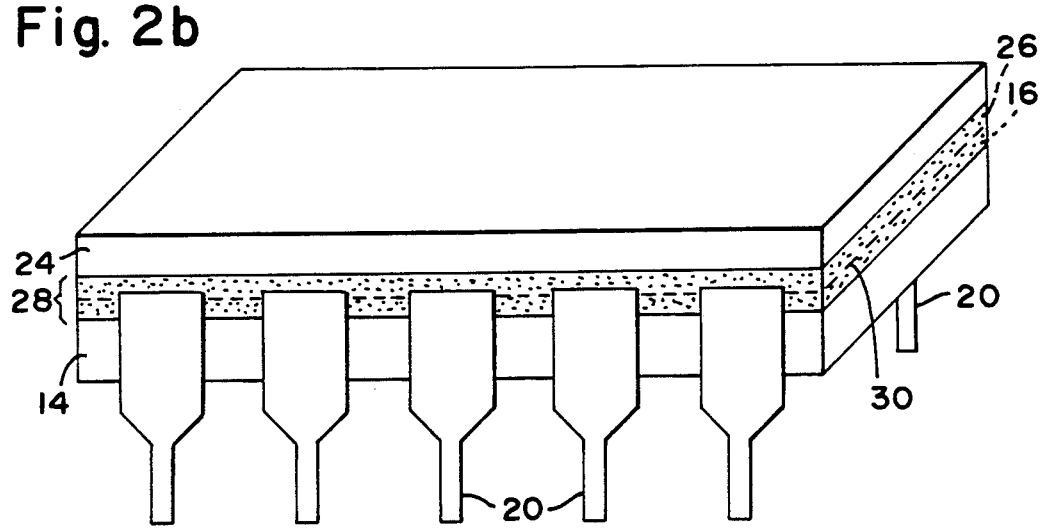

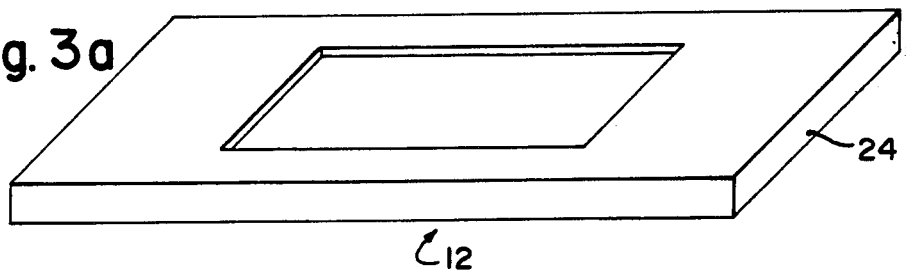
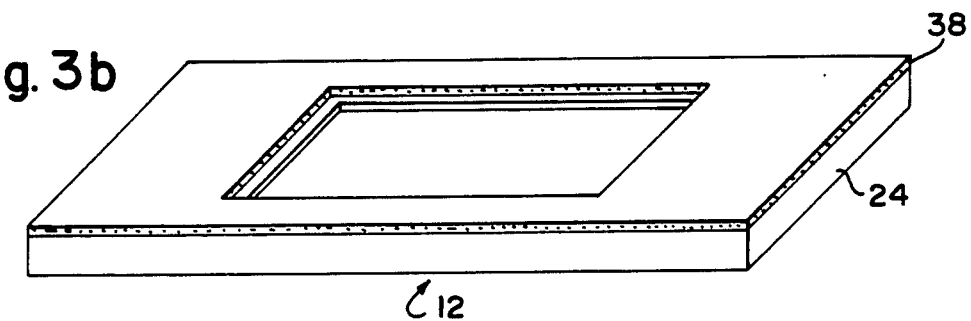
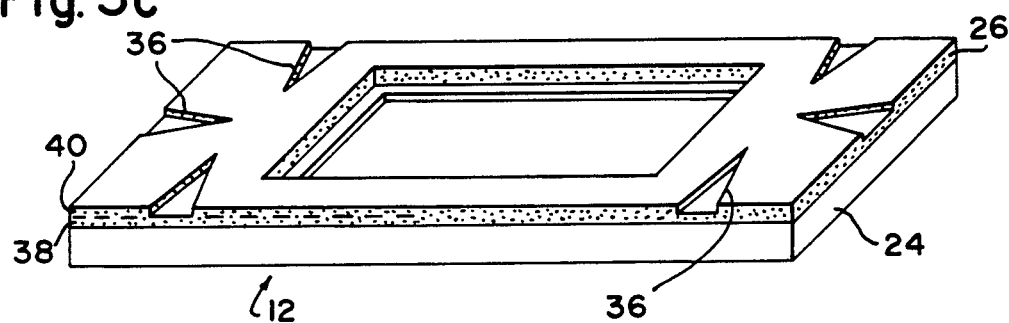
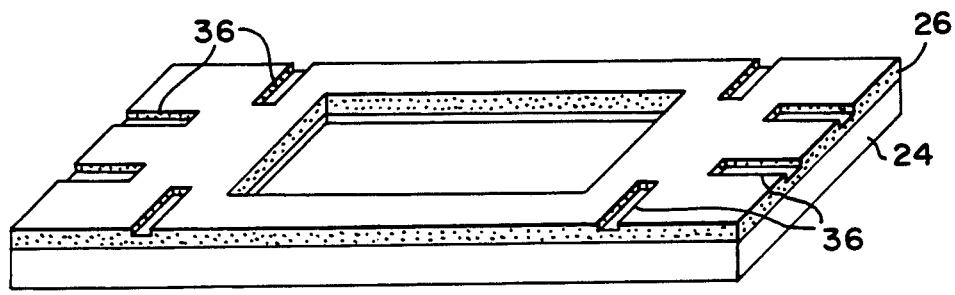

USE OF VENTING SLOTS TO IMPROVE HERMETIC SEAL FOR SEMICONDUCTOR DICE HOUSED IN CERAMIC PACKAGES

This application is a continuation of application Ser. No. 07/210051 filed 6-22-88, now abandoned.

FIELD OF USE

This invention relates to ceramic packaging of semiconductor devices.

BACKGROUND ART

Semiconductor dice are hermetically sealed in ceramic packages to protect the dice from corrosive elements, principally moisture, in the external environment. Referring to the drawings, FIGS. 1a and 1b illustrate how a base structure 10 of a dual-in-line ceramic package for a semiconductor device is hermetically sealed to a cap structure 12 of the package according to a conventional sealing technique. Structures 10 and 12 are initially separated as shown in FIG. 1a.

Base structure 10 is built up from a rectangular ceramic base 14 having a flat lower surface. An electrically insulating base sealing layer 16 lies on the upper surface of base 14. A rectangular base cavity passes through sealing layer 16 and extends partway into base 14. Although not shown in FIG. 1a, the inner lateral boundary of layer 16 is normally recessed slightly back from the inner wall of base 14 along the cavity. A semiconductor integrated-circuit die 18 is mounted on base 14 within the base cavity.

A group of electrical leads 20, arranged in a digitated pattern, are partly sunk into sealing layer 16 along its upper surface. Each lead 20 extends beyond the outer lateral boundaries of base 14 and layer 16. Leads 20 are bent downward in a symmetrical configuration along the two long outer sides of layer 16. At this point in the sealing operation, the outer ends of leads 20 are usually connected to a lead frame not depicted in the drawings. A corresponding group of electrical bond wires 22 respectively connect leads 20 to bond pads of die 18.

Cap structure 12 is centered on a rectangular ceramic cap 24 having a flat upper surface. Cap 24 has substantially the same length and width as base 14. An electrically insulating cap sealing layer 26 lies on the lower surface of cap 24. A rectangular cap cavity passes through cap sealing layer 26 and extends partway into cap 24. The cap cavity has somewhat greater lateral dimensions than the base cavity but is otherwise in vertical alignment with the base cavity so that the two cavities form a composite die cavity when the package is sealed. As with components 14 and 16 and likewise not indicated in FIG. 1a, the inner lateral boundary of layer 26 is normally recessed slightly back from the inner wall of cap 24 along the cap cavity.

Sealing layers 16 and 26 consist of a glass whose softening point is relatively low. The softening point is the approximate temperature at which the seal glass starts to flow readily. In particular, the seal glass softens at a temperature significantly less than that at which any of components 14, 18, 20, 22, and 24 begin to melt or soften.

To seal structures 10 and 12 together, they are first aligned as indicated in FIG. 1a (except that base structure 10 is usually on top) and brought into contact along sealing layers 16 and 26 and leads 20. Structures 10 and 12 are then heated to a temperature adequate to cause the seal glass to flow but not high enough to cause any significant melting or softening of the other device components. Structures 10 and 12 thereby fuse together along layers 16 and 26 and leads 20.

The final step is to cool the resultant structure down to room temperature. Sealing layers 16 and 26 harden into a unitary glass layer 28. Leads 20 protrude from layer 28 as shown in FIG. 1b. Dashed line 30 in FIG. 1b generally indicates the sealing interface where layers 16 and 26 meet each other.

One difficulty with the foregoing procedure is that air bubbles (or pockets) often form in glass layer 28 along interface 30 during the sealing operation. The air bubbles generally arise in the areas between leads 20. The largest areas between adjacent leads 20 occur in the two rectangular end sections respectively located between the short outer sides of layer 28 and the nearest boundaries of the die cavity. Consequently, the largest bubbles form in the end sections. Area 32 in FIG. 1a indicates a typical location for a large air pocket.

The air bubbles reduce the mechanical strength of the package and help cause cracks to occur in sealing glass 28 during handling, shipping, and thermal cycling. Item 34 in FIG. 1b indicates the location for a typical crack resulting from an air bubble formed at area 32 in FIG. 1a. The cracks lead to leaks—i.e., channels from the die cavity to the outside of the package. As a result of the loss in hermeticity, moisture enters the package and eventually causes device failure.

In Japanese Patent Publication (Kokai) 53-39859, Suduo approaches the leakage problem by creating cap sealing layer 26 in such a way that it is thicker at the areas where the largest air pockets usually form. Suduo's approach is, however, disadvantageous in one of two alternative aspects. If layer 26 is of the normal thickness at the locations for the largest air pockets but is thinner than normal in the remaining area, the integrity of the seal may be significantly reduced in the thinner area. Conversely, if layer 26 is thicker than normal at the areas for the largest bubbles but is of normal thickness elsewhere, some additional fabrication time is needed.

GENERAL DISCLOSURE OF THE INVENTION

The present invention centers around venting slots that are employed in hermetically sealing a cap structure of a ceramic package for a semiconductor device to a base structure of the package. Use of the present venting slots sharply reduces bubble formation. The package can thereby withstand environmentally caused stresses much better than in the basic prior art sealing technique discussed above. The invention also solves the leakage problem without incurring either of the alternative disadvantages of Suduo.

The principal components of the base structure are a ceramic base, a base sealing layer, a semiconductor die, a plurality of electrical leads, and a mechanism for electrically connecting the leads to the die. The base sealing layer adjoins the base. The die is mounted on the base in a cavity passing through the sealing layer. The leads adjoin the sealing layer opposite the base and extend beyond the outer lateral boundary of the base.

The main components of the cap structure are a ceramic cap and a cap sealing layer that adjoins the cap. A cavity passes through the cap sealing layer.

In accordance with the invention, a specified one of the sealing layers is provided with one or more venting slots that are situated along the outer lateral boundary of the specified layer and extend laterally inward, preferably to internal locations spaced apart from the cavity through that layer. Each venting slot passes at least partway through the thickness of the specified layer. In the preferred case, the specified layer is the cap sealing layer. Each slot is optimally shaped as a wedge whose maximum width is along the outer lateral boundary of the specified layer.

With the specified layer configured in the foregoing manner, the base and cap structures are fused together along the sealing layers and leads. This is done by bringing the two structures into suitable contact and heating them to a temperature sufficient to cause the material of the sealing layers to flow readily but insufficient to cause any significant melting or softening to occur in any of the other device components. The venting slots permit air to escape during the fusing step. This greatly inhibits the formation of air bubbles along the sealing interface. Because the sealing material becomes liquidous during the fusing step, the venting slots flatten out and disappear as the structures are fused together. The sealing operation is completed by cooling the device to a temperature low enough to harden the sealing layers into a unitary layer from which the leads protrude.

BRIEF DESCRIPTION OF THE DRAWINGS

FIGS. 1a and 1b are three-dimensional (3-D) views of a ceramic packaged dual-in-line semiconductor device at the beginning and end of the fusing step in a prior art sealing operation.

FIGS. 2a and 2b are 3-D views of a ceramic packaged dual-in-line semiconductor device at the beginning and end of the fusing step in a hermetic sealing operation according to the invention.

FIGS. 3a, 3b, and 3c are 3-D views illustrating a preferred set of steps for creating the venting slots in the cap structure of FIG. 2a.

FIG. 4 is a 3-D view of an alternative version of a cap structure provided with venting slots in accordance with the invention.

Like reference symbols are employed in the drawings and in the description of the preferred embodiments to represent the same or very similar item or items.

DESCRIPTION OF THE PREFERRED EMBODIMENTS

FIGS. 2a and 2b show an example of how a group of venting slots 36 are employed in sealing base structure 10 of a dual-in-line ceramic package for a semiconductor device to cap structure 12 of the package. FIG. 2a illustrates the situation that exists after slots 36 are created but before structures 10 and 12 are fused together.

Except for venting slots 36, base structure 10 in FIG. 2a consists of ceramic base 14, base sealing layer 16, semiconductor die 18, electrical leads 20, and bond wires 22 constituted and arranged the same as discussed above and shown in FIG. 1a, while cap structure 12 in FIG. 2a consists of ceramic cap 24 and cap sealing layer 26 constituted and arranged the same as discussed above and shown in FIG. 1a. Sealing layers 16 and 26 are again formed with a glass that softens at a temperature considerably below that at which any of the other components start to melt or soften. The base and cap cavities in FIG. 2a have the same dimensions as in FIG. 1a.

Venting slots 36 are provided in a specified one of sealing layers 16 and 26. In the present example, the specified layer is layer 26 (in cap structure 12). This is the preferred case since the pattern of leads 20 does not limit where slots 36 can be placed.

Each of venting slots 36 is located along the outer lateral boundary of cap sealing layer 26 and extends laterally inward to an internal location spaced apart from the cap cavity. More specifically, slots 36 are situated along the outer lateral boundaries of both end sections where the largest air bubbles have tended to form in the seal glass of prior art dual-in-line ceramic packages. At least one slot 36 preferably lies along each of the short outer sides of layer 26.

Slots 36 extend partway through layer 26 in the example shown in FIG. 2a. However, depending on the thickness of layer 26, slots 36 might pass all the way through. Each slot 36 is preferably created in the shape of a wedge having its maximum width along the outer lateral boundary of layer 26.

Having so created slots 36, structures 10 and 12 are fused together by aligning them as shown in FIG. 2a (with base structure 10 on top), bringing them into contact along sealing layers 16 and 26 and leads 20, and then heating the package to a temperature that causes the seal glass to flow but does not cause any of the other device components to melt or soften significantly. The fusing step is performed in a furnace utilizing a conventional conveyor-belt alignment mechanism.

During the fusing procedure, slots 36 allow air to escape from the areas along sealing interface 30 where air pockets have formed in ceramic packages sealed according to the basic prior art technique. This greatly reduces the amount of bubble formation. No large bubbles are produced along interface 30 in the end sections of the package. As layers 16 and 26 come together, the liquidous nature of the seal glass allows slots 36 to flatten out and disappear. The wedge shape used for slots 36 facilitates the flattening by causing the seal glass to move from the inside toward the outer lateral glass boundary.

Next, the package is removed from the furnace and cooled down to room temperature to complete the sealing. Layers 16 and 26 again harden into unitary glass layer 28 as indicated in FIG. 2b. Due to the usage of venting slots 36 and the consequent elimination of large air bubbles, substantially no cracks (such as that manifested by item 34 in FIG. 1b) form in glass layer 28 during subsequent handling, shipping, and thermal cycling.

In a preferred embodiment, the ceramic used to make base 14 and cap 24 is approximately 90% alumina. The thickness of base 14 is 75–80 mils. The base cavity goes 15–26 mils into base 14 depending on wafer size. The thickness of cap 24 is about 50 mils. The cap cavity goes 15–20 mils into cap 24. Leads 20 are formed with Alloy 42 (40–43% nickel and the remainder being iron) and have a thickness of 10 mils.

Layers 16 and 26 consist of Iwaki T187 glass (containing 55–60% lead oxide and 15–20% tin oxide). The softening point of T187 is 340°–345° C. Structures 10 and 12 are heated to about 440° C. during the fusing step.

Each of sealing layers 16 and 26 is preferably fabricated to a thickness of 14–20 mils by a silk-screen printing process using several—typically 4—individual selective-deposition steps. FIGS. 3a–3c illustrate how slots 36 are formed in layer 26. The starting point is cap 24 in which the beginning of the cap cavity is already present. See FIG. 3a. The vertical orientation of cap 24 in FIG. 3a is reversed from that illustrated in FIG. 2a.

Using a silk screen (not shown) that has blocking material at the location for the cap cavity, a liquid mixture of powered glass, a binder, and a solvent is selectively deposited on cap 24 to form a first sublayer 38. FIG. 3b shows the structure at this point. The deposition usually take two or three selective-deposition steps and one drying step.

Using another silk screen (not shown) that has blocking material areas at the locations for the cap cavity and slots 36, a second sublayer 40 of the glass mixture is selectively deposited on first sublayer 38. See FIG. 3c. The second deposition usually takes one or two selective-deposition steps and one drying step. The structure is then glazed to convert sublayers 38 and 40 into sealing layer 26. The recessing of the inner boundary of layer 26 back from the inner lateral wall of cap 24 along the cap cavity is explicitly depicted in FIG. 3c.

Approximately the same thickness of seal glass is deposited in each of the selective-deposition steps. Consequently, the thickness (or height) of venting slots 36 is less than or equal to one half the thickness of layer 26 in the present example. The slot width along the outer lateral boundary of layer 26 (i.e., the maximum slot width) is about 80 mils. Slots 36 extend laterally about 150 mils into layer 26.

Shapes other than a wedge can be employed for slots 36. The number of slots 36 used and the way in which they are patterned depends on the configuration of the package. For example, FIG. 4 illustrates an alternative version of cap structure 12 in which there are eight venting slots 36, each shaped as a groove of largely constant width.

While the invention has been described with reference to particular embodiments, this description is solely for the purpose of illustration and is not to be construed as limiting the scope of the invention claimed below. For example, the invention could be utilized for packages other than the dual-in-line type. Venting slots could be provided in the base sealing layer rather than the cap sealing layer. Furthermore, venting slots could be provided in both layers.

The sealing layers could be formed by techniques other than screen printing. The layers might consist of a plastic having a low melting or softening point. If the leads (and, if necessary, the bond wires) are provided with suitable electrical insulation, the sealing layers might even consist of an electrically conductive material such as a solder. Various modifications and applications may be thus made by those skilled in the art without departing from the true scope and spirit of the invention as defined in the appended claims.

We claim:

1. A method for sealing a cap structure of a package for a semiconductor device to a base structure of the package where: the base structure comprises a generally rectangular ceramic base, a generally rectangular base sealing layer that adjoins the base, a semiconductor die mounted on the base in a base cavity passing through the base sealing layer, a plurality of electrical leads that adjoin the base sealing layer opposite the base and extend beyond the outer lateral boundary of the base, and means for electrically connecting the leads to the die; the cap structure comprises a generally rectangular ceramic cap and a generally rectangular cap sealing layer that adjoins the cap, a cap cavity passing through the cap sealing layer; and the method involves the steps of (a) fusing the structures together by bringing them into contact along the sealing layers and leads and heating the structures to a temperature sufficient to cause the material of the sealing layers to flow readily but insufficient to cause any significant melting or softening of the base, die, leads, connecting means, or cap, and (b) cooling the resultant structure to a temperature low enough to harden the sealing layers into a unitary layer from which the leads protrude; characterized, before the fusing step, by the step of providing a specified one of the sealing layers with at least two venting slots located along the outer lateral boundary of the specified layer spaced apart from the four corners of the specified layer and extending laterally inward beyond the outer lateral boundaries of both the base and cap when the structures are aligned, each slot passing at least partway through the thickness of the specified layer, whereby the slots flatten out and substantially disappear during the fusing step.

2. A method as in claim 1 characterized in that the specified layer is the cap sealing layer.

3. A method as in claim 2 characterized in that the providing step comprises (a) selectively depositing a first sublayer of glass-containing matter on the cap but not at the location for the cap cavity and (b) selectively depositing a second sublayer of the glass-containing matter on the first sublayer but not at the locations for the cap cavity and slots.

4. A method as in claim 1 characterized in that each slot is laterally shaped like a wedge whose maximum width is along the outer lateral boundary of the specified layer.

5. A method as in claim 1 wherein the sealing layers meet each other at a sealing interface during the fusing step, characterized in that, during the fusing step, the slots allow air to escape from areas along the sealing interface so as to inhibit formation of air bubbles along the sealing interface.

6. A method as in claim 5 characterized in that the specified layer is the cap sealing layer.

7. A method as in claim 6 characterized in that each slot extends laterally in the specified layer to an internal location spaced apart from the cavity through that layer.

8. A method as in claim 1 characterized in that two of the slots are provided along opposing outer sides of the specified layer, each of these sides having one of these two slots.

9. A method as in claim 8 characterized in that the specified layer is the cap sealing layer.

10. A method as in claim 1 wherein each sealing layer has a pair of opposing long outer sides and a pair of opposing short outer sides, the leads extending beyond the outer lateral boundary of the base sealing layer along its long outer sides, characterized in that at least one of the slots is provided along each of the short outer sides of the specified layer.

11. A method as in claim 10 characterized in that the specified layer is the cap sealing layer.

* * * * *